(12) United States Patent
Wasson

(10) Patent No.: US 6,449,628 B1
(45) Date of Patent: Sep. 10, 2002

(54) APPARATUS AND METHOD FOR PROGRAMMABLE DATAPATH ARITHMETIC ARRAYS

(75) Inventor: Stephen L. Wasson, Boulder Creek, CA (US)

(73) Assignee: Morphics Technology, Inc., Campbell, CA (US)

( * ) Notice: Subject to any disclaimer, the term of this patent is extended or adjusted under 35 U.S.C. 154(b) by 0 days.

(21) Appl. No.: 09/565,649

(22) Filed: May 5, 2000

Related U.S. Application Data

(60) Provisional application No. 60/133,134, filed on May 7, 1999.

(51) Int. Cl.[7] .......................... G06F 7/38; H03K 19/177
(52) U.S. Cl. .......................... 708/230; 708/232; 326/41
(58) Field of Search ................. 708/230, 232, 708/234, 235, 236; 716/16; 326/37, 38, 39, 41

(56) References Cited

U.S. PATENT DOCUMENTS

| | | | |
|---|---|---|---|
| 4,580,215 A | * | 4/1986 | Morton ................. 708/232 |
| 4,935,734 A | | 6/1990 | Austin |
| 5,231,588 A | * | 7/1993 | Agrawal et al. ............... 326/41 |
| 5,329,470 A | | 7/1994 | Sample et al. |
| 5,398,198 A | | 3/1995 | Mahant-Shetti et al. |
| 5,796,623 A | | 8/1998 | Butts et al. |
| 5,943,242 A | | 8/1999 | Vorbach et al. |
| 5,946,219 A | | 8/1999 | Mason et al. |

FOREIGN PATENT DOCUMENTS

WO    WO 98/21725 A2    5/1998

\* cited by examiner

*Primary Examiner*—Chuong Dinh Ngo
(74) *Attorney, Agent, or Firm*—Pennie & Edmonds LLP

(57) ABSTRACT

A programmable data arithmetic array includes a set of data buses and a matrix of data arithmetic units including fixed function units and programmable function units connected to the set of data buses. Bidirectional interconnect is positioned between the set of data buses and the matrix of data arithmetic units.

9 Claims, 12 Drawing Sheets

Di+1: next bus bit
Di:   corresponding bus bit
Di-1: previous bus bit

Qi+1: next bit-slice Output
Qi-1: previous bit-slice Output
Ci:   previous bit-slice Carry Out CO:   Carry Out to next Bit-Slice ADD:  ADD/SUB control
Q/D:  Q vs D source select
U/D:  Shift Direction control
SH:   Shift control
L:    Load control
CE:   Clock Enable control
R:    Synchronous Reset
Q/Y:  Output source select K:    Clock O:    Carry Out to next Bit-Slice

*FIG. 5B*

APPARATUS AND METHOD FOR PROGRAMMABLE DATAPATH ARITHMETIC ARRAYS

This application claims priority to the provisional application bearing serial No. 60/133,134 filed on May 7, 1999.

BRIEF DESCRIPTION OF THE INVENTION

This invention relates generally to logic circuits that are used to perform computationally intensive tasks. More particularly, this invention relates to a hybrid logic circuit that is useful for computationally intensive tasks, such as wireless communications.

BACKGROUND OF THE INVENTION

Programmable logic devices are widely used in the electronics industry. Conventional programmable logic devices typically comprise a general-purpose logic array and general-purpose interconnect. The typical logic array in general-purpose Field Programmable Gate Arrays (FPGAs) is designed to accommodate some random/control logic functionality and some structured/datapath logic functionality. Using FPGAs can be very inefficient when the programmed logic function comprises many datapath functions. Inefficient device utilization and performance degradation result when general-purpose random/control logic and routing resources are used for structured datapath functions. The more general-purpose the device architecture, the greater the inefficiency and performance degradation incurred by structured datapath functions.

In view of the foregoing, it would be highly desirable to provide a programmable architecture that improved the performance of structured datapath functions and improved device utilization efficiency.

SUMMARY OF THE INVENTION

A programmable datapath arithmetic array includes resources that are data buses connected to a matrix of data arithmetic units including fixed function units and programmable function units. In an exemplary embodiment, the programmable datapath arithmetic array includes only fixed function units. In another exemplary embodiment, the programmable datapath arithmetic array includes only programmable function units. Bidirectional interconnect is positioned between the data buses and the matrix of data arithmetic units to facilitate dynamic reconfiguration and operability of the programmable datapath arithmetic array.

Unlike field programmable gate arrays (FPGAs), the programmable datapath arithmetic array includes two organized logic resources, namely, datapath slices and datapath structures. In an exemplary embodiment, the programmable datapath arithmetic array comprises an array of datapath slices. For example, when the programmable datapath arithmetic array is a 1×N array, N represents the number of datapath slices. A datapath slice comprises an array of datapath structures. In an exemplary embodiment, if a datapath slice is a 1×M array, M represents the number of datapath structures. A datapath structure comprises an array of bit-slice blocks. In an exemplary embodiment, if a datapath structure is a 1×L array, L represents the number of bit-slice blocks. Bit-slice blocks comprise building blocks of the programmable datapath arithmetic array. A bit-slice block comprises a bit-specific portion and a common-control portion. In an exemplary embodiment, the programmable datapath arithmetic array comprises two types of datapath structures, namely fixed and re-programmable datapath structures. Fixed datapath structures implement a limited set of functions whereas re-programmable datapath structures implement a relatively larger set of functions.

The programmable datapath arithmetic array includes dedicated routing resources. Further, in a preferred embodiment, the programmable datapath arithmetic array comprises coarse-grained logic. In an exemplary embodiment, the programmable datapath arithmetic array is designed to facilitate and accelerate datapath functions. Examples of datapath functions are counters, incrementers, decrementers, shifters, scalers, adders, subtractors, accumulators, and decumulators. In an exemplary embodiment, datapath functions exhibit a uniformity of structure across all bits.

BRIEF DESCRIPTION OF THE DRAWINGS

FIG. 5B illustrates an exemplary list of control signals in accordance with an embodiment of the invention.

DETAILED DESCRIPTION OF THE INVENTION

Figure 1:
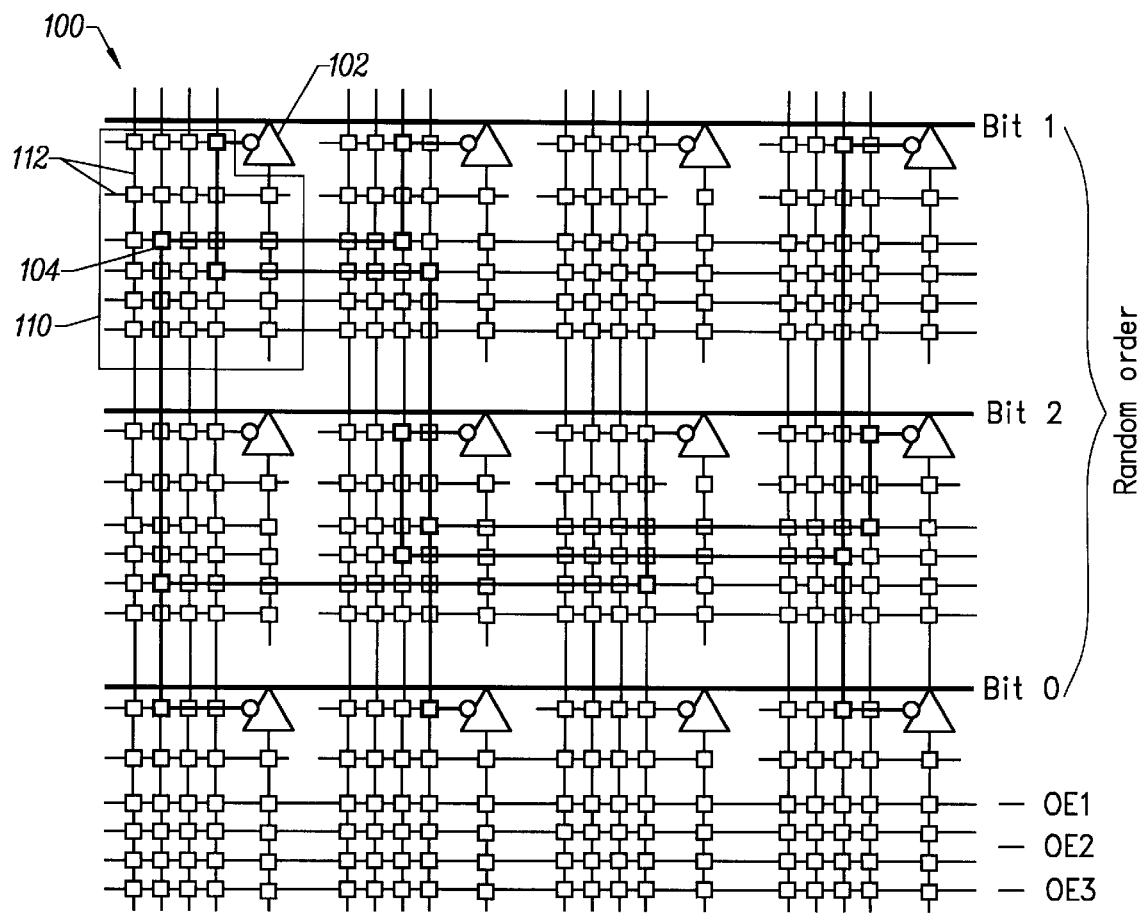
FIG. 1 illustrates a prior art field programmable gate array implemented to provide a datapath function.

FIG. 1 illustrates a prior art field programmable gate array 100 (FPGA) implemented to provide a datapath function. The FPGA 100 includes bussed functions assembled from general resources. Each bus bit is formed by connecting three-state drivers 102 and programmable interconnect points 104 nondeterministically. More particularly, each three-state driver 102 has an associated array of resources 110. Each resource array 110 includes programmable interconnect points 104 with signal lines 112 positioned between programmable interconnect points 104. As shown in FIG. 1, bussed functions are randomly programmed by using programmable interconnect points 104 and signal lines 112 in the FPGA 100.

Figure 2:
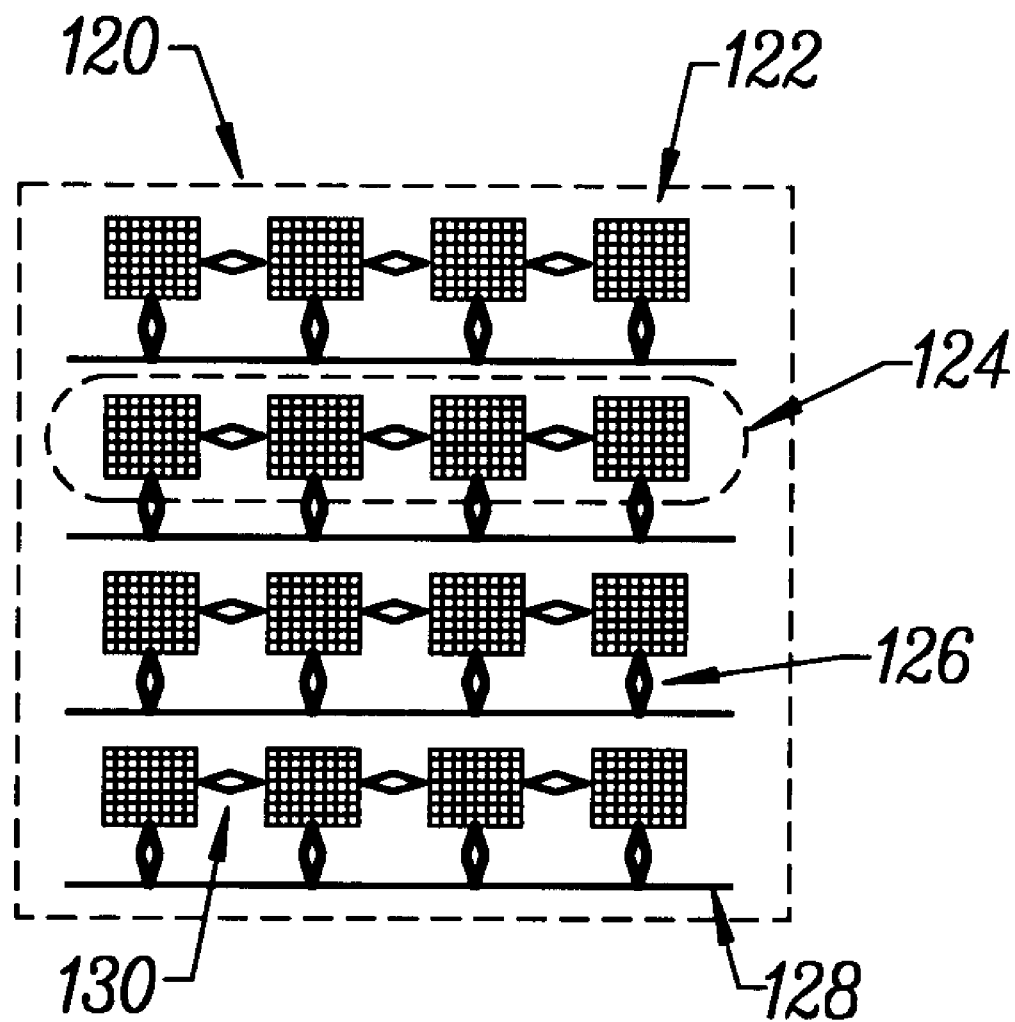
FIG. 2 illustrates a programmable datapath arithmetic array arithmetic in accordance with an embodiment of the invention.

FIG. 2 illustrates a programmable datapath arithmetic array 120 in accordance with an embodiment of the invention. The array 120 is comprised of a matrix of datapath units 122. Each datapath unit 122 can be either a fixed function unit or a re-programmable function unit. A re-programmable function unit can comprise generic programmable logic blocks, for example, field programmable gate arrays. Further, the re-programmable function units comprise finer granularity and intraconnect for dynamic configuration of functionality. A fixed function unit is a specific functional block, including, but not limited to, multiply-accumulate circuits, barrel shifters, comparators, counters, parity generators, masking function circuits, packing function circuits, and ordering function circuits.

As shown in FIG. 2, a row of datapath arithmetic units 122 forms bussed datapath arithmetic units 124. Programmable bidirectional interconnect 126 links each datapath arithmetic unit 122 to resources programmed to be used as a data bus 128. Preferably, datapath arithmetic unit interconnect 130 is also used to link adjacent datapath arithmetic units 122. The programmable datapath arithmetic array 120 supports the execution of computationally intensive algorithms.

Figure 3A:
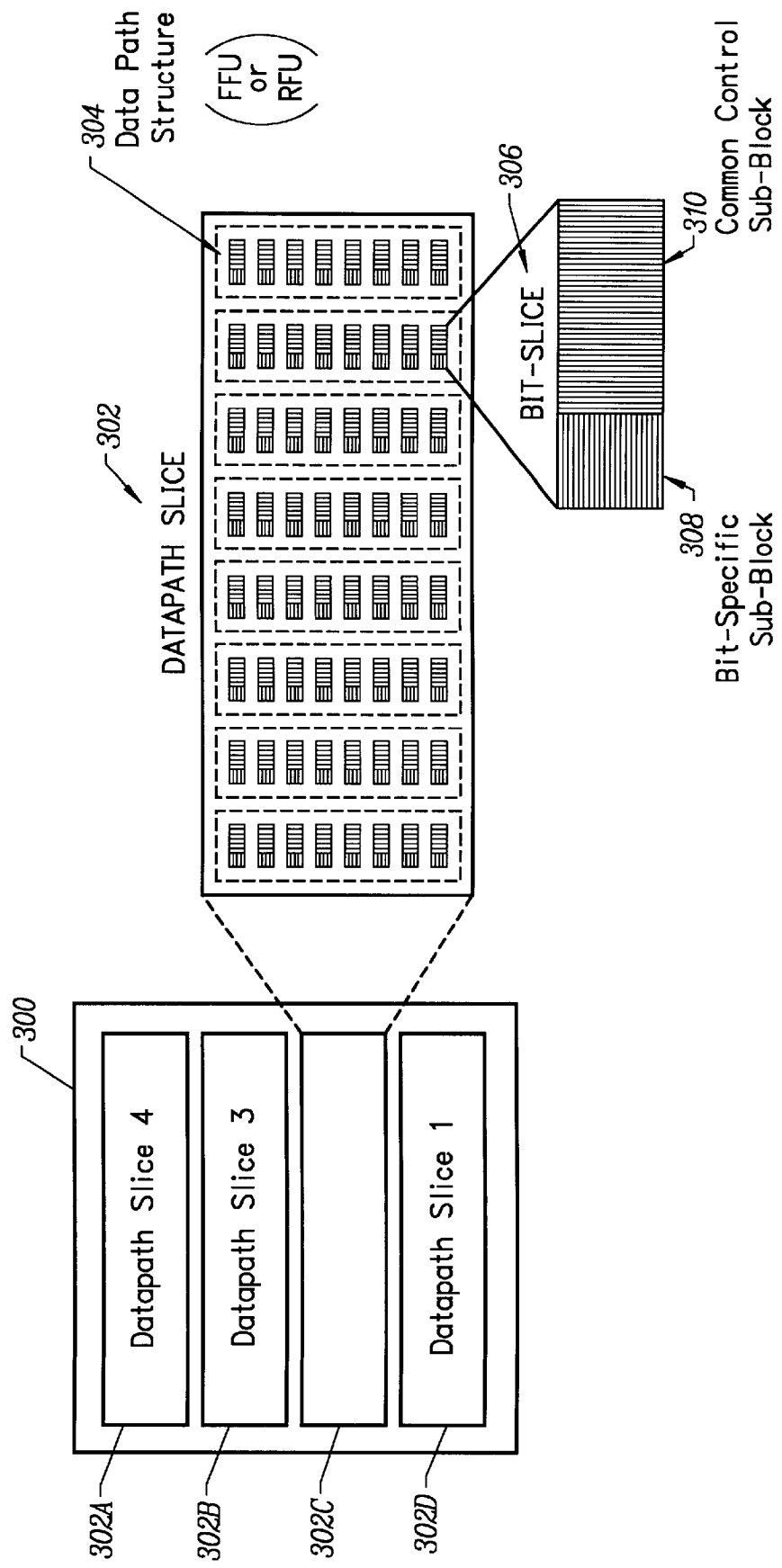
FIG. 3A illustrates a programmable datapath arithmetic array in accordance with an embodiment of the invention.

FIG. 3A illustrates an exemplary programmable datapath arithmetic array 300 in accordance with an embodiment of the invention. The programmable datapath artithmetic array includes a set of datapath slices 302A, 302B, 302C, and 302D. Each datapath slice 302 includes a set of datapath structures 304. Each datapath structure 304 includes a set of bit-slice blocks 306. Each bit-slice block 306 includes a bit-specific sub-block 308 and a common control sub-block 310.

Figure 3B:
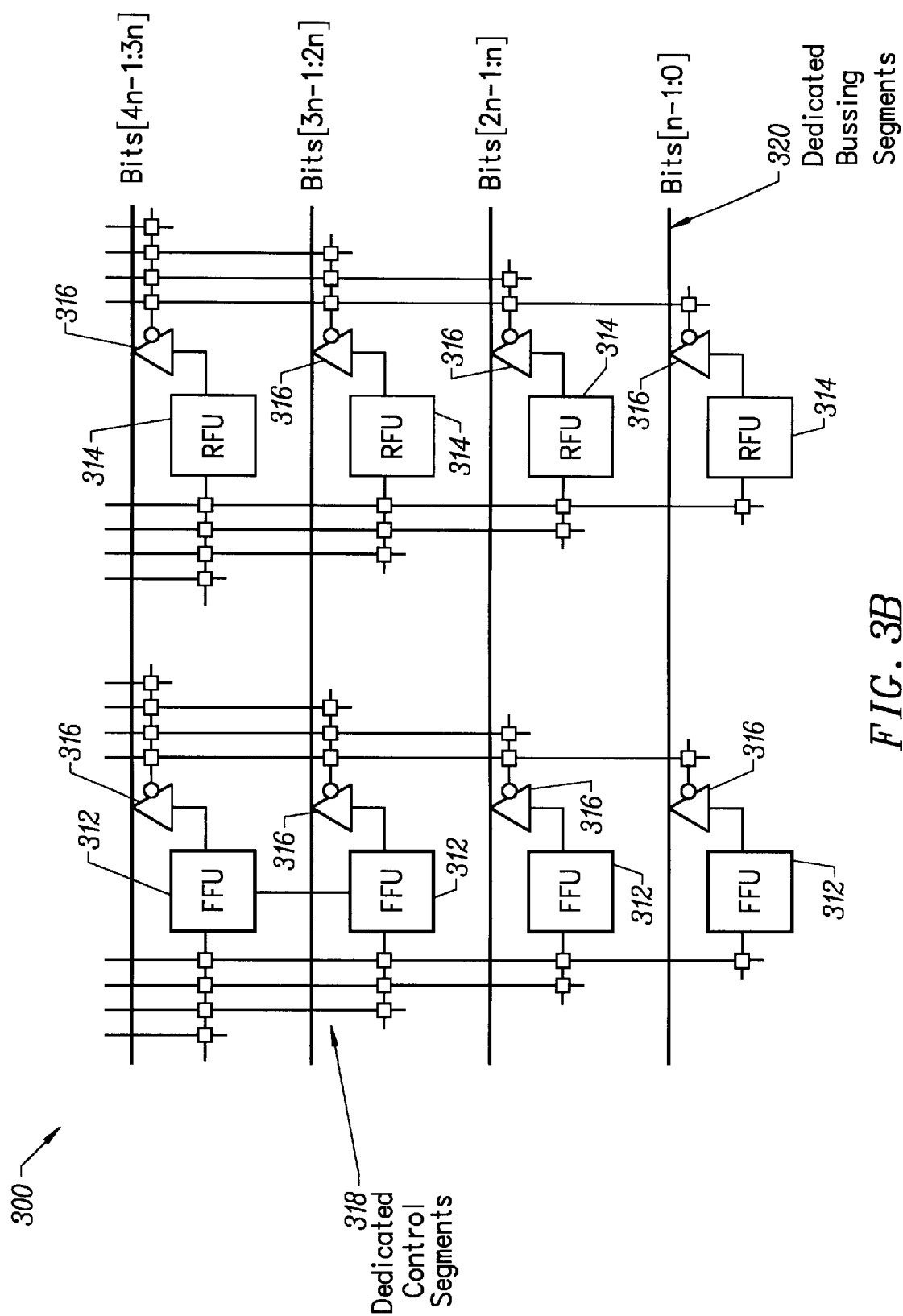
FIG. 3B illustrates a programmable datapath arithmetic array in accordance with an embodiment of the invention.

FIG. 3B illustrates an exemplary programmable datapath arithmetic array 300 in accordance with an embodiment of the invention. The programmable datapath arithmetic array 300 includes a plurality of fixed function units 312 and a plurality of re-programmable function units 314. Each unit, either fixed or re-programmable, is connected to a dedicated three-state driver 316, dedicated control interconnect points 318, and dedicated bussing segments 320. Thus, the programmable datapath arithmetic array logic and routing resources are organized into n-bit groups.

The fixed function units 312 may have programmable interconnect to control width and depth attributes. Fixed function units 312 may perform identical or similar functions. Further, fixed function units 312, although fixed in function, may be programmable in width and/or depth. The fixed function unit programmable extensibility may be performed either within a fixed function unit 312 or by concatenating fixed function units 312. The invention provides fixed function units 312 and re-programmable function units 314 on a single device. A common datapath is used for both the fixed function units and the programmable function units.

Figure 4:
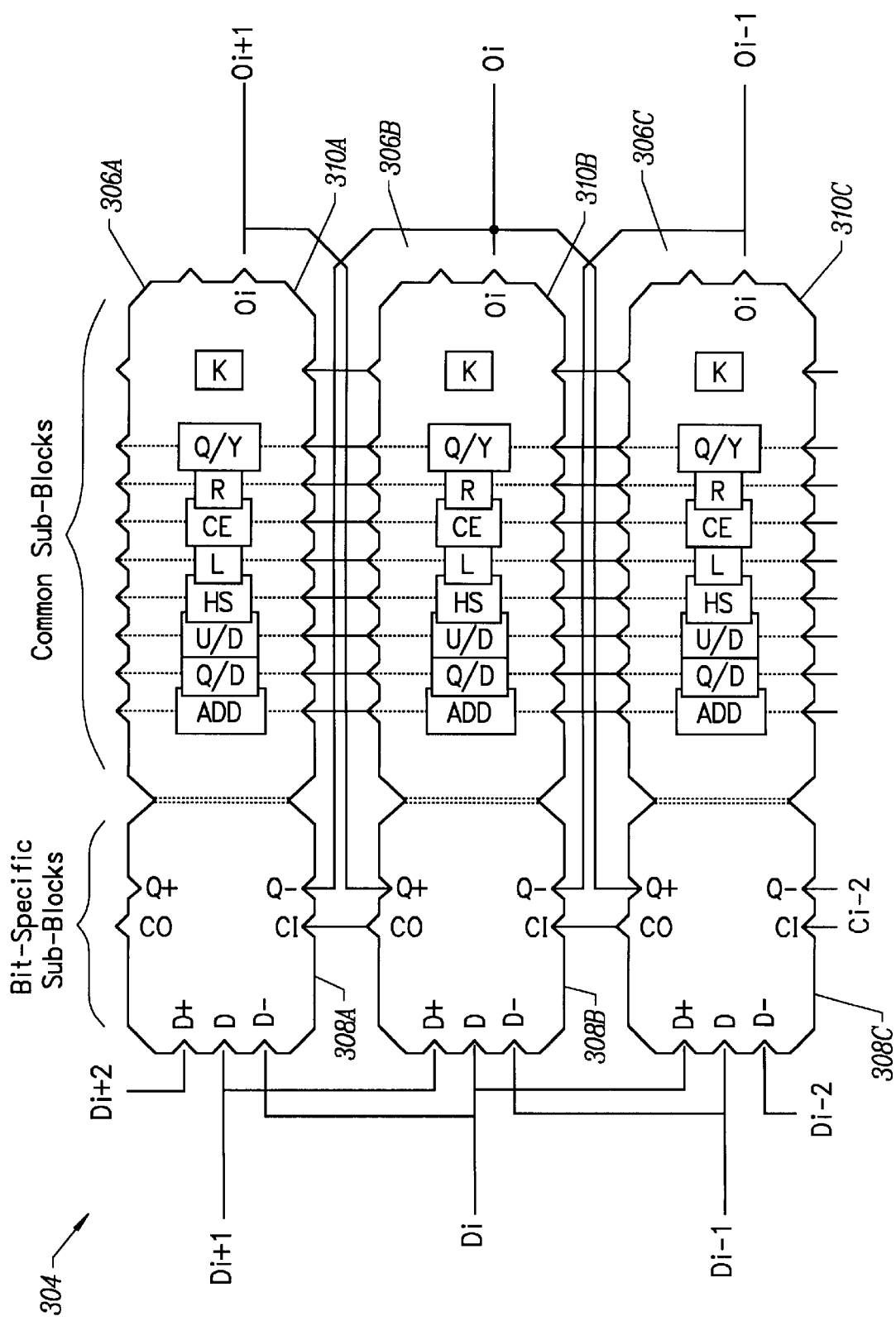
FIG. 4 illustrates exemplary bit-slice blocks in accordance with an embodiment of the invention.

FIG. 4 illustrates exemplary bit-slice blocks 306 in a datapath structure 304 in accordance with an embodiment of the invention. Each bit-slice block 306 includes a bit-specific sub-block 308 and a common control sub-block 310. Each bit-specific sub-block 308 in a bit-slice block 306 is unique when compared to bit specific sub-blocks in other bit-slice blocks 306. The bit-specific sub-block 308 accepts inputs from the corresponding and adjacent databus bit(s) within a datapath structure 304. For example, for a bit-slice block i, the bit-specific sub-block 308 accepts bus inputs from Di, Di+1 and Di−1, from bit outputs Qi+1 and Qi−1, and from carry-in Ci of the previous stage. Additionally, the least significant bit of the bit-specific sub-block 308 contains cascade logic to permit the concatenation (extension) of vertically adjacent datapath structures 304.

The common control sub-block 310 of a bit-slice block 306 includes components common to all common control sub-blocks 310 in other bit-slice blocks 306 of the datapath structure 304. Further, components of all common control sub-blocks in a datapath structure are driven by common control inputs. In the case of a re-programmable datapath structure 304, the control inputs for the common control sub-blocks 310 are determined by the function programmed into the datapath structure 304.

FIG. 4 illustrates an exemplary interconnect relationship between three bit-slice blocks 306A, 306B, and 306C. The bit-slice blocks 306A, 306B, and 306C comprise a datapath structure 304. The middle bit slice block 306B, having databus input Di and output Oi, accepts adjacent databus bits Di−1 and D+1, as well as adjacent bit-slice outputs Qi−1 and Qi+1. A Carry chain begins at the Ci−2 node of the bit-specific sub-block 308C. The carry chain Ci−2 proceeds upward through the bit-slice block 306C and exits out of the top to be provided to the vertically adjacent bit-slice block 306B, then to bit-slice block 306A. In an exemplary embodiment, common control lines (ADD, Q/D, U/D, SH, L, CE, R, and Q/Y) are applied to the bottom bit-slice block 306C at the common control sub-block 310C, then to other bit-slice blocks 306B and 306A at their respective common control sub-blocks 3101B, 310A. The functions of the common control lines are set forth in FIG. 5B.

Figure 5A:
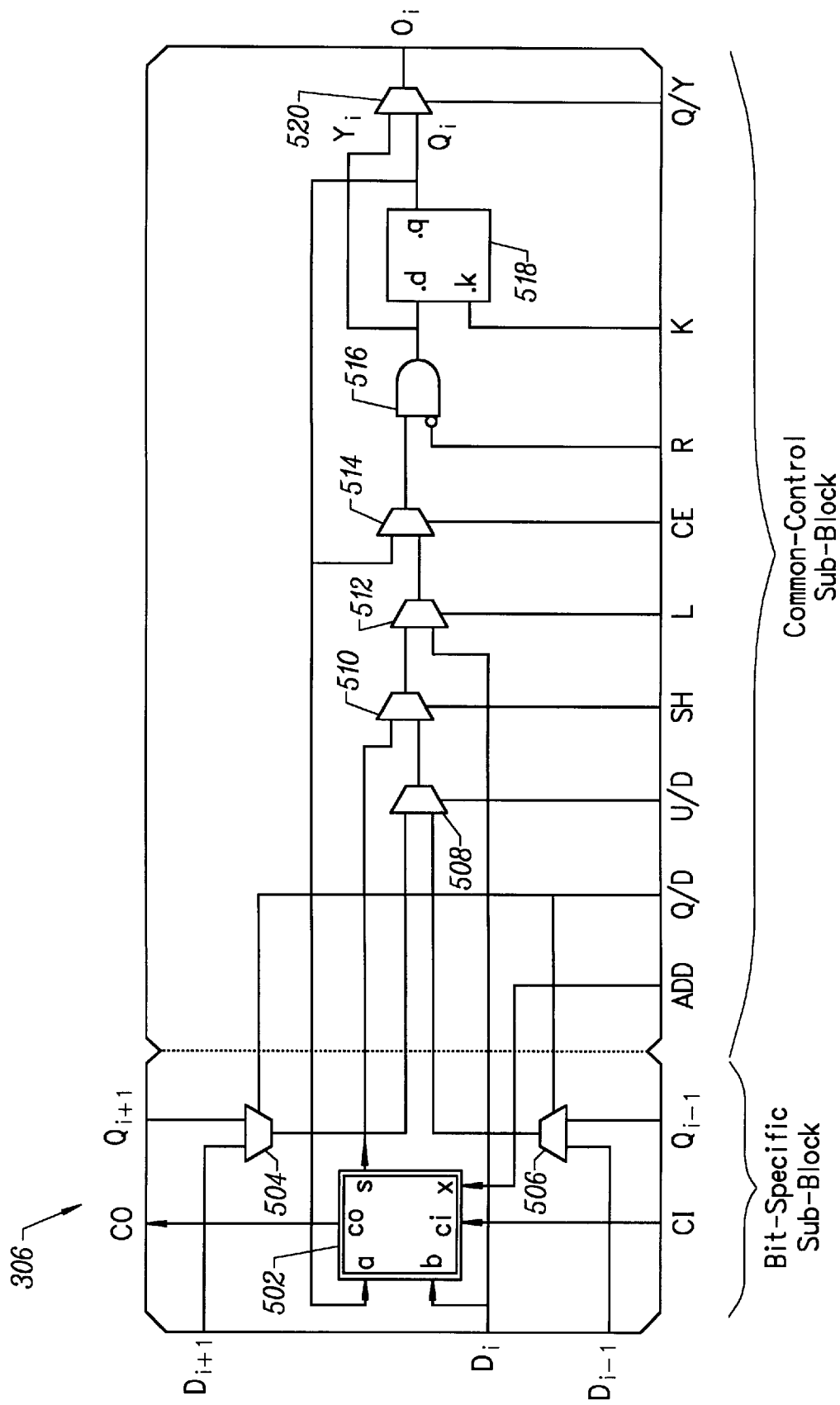
FIG. 5A illustrates a fixed function bit-slice block in accordance with an embodiment of the invention.
Figure 6:
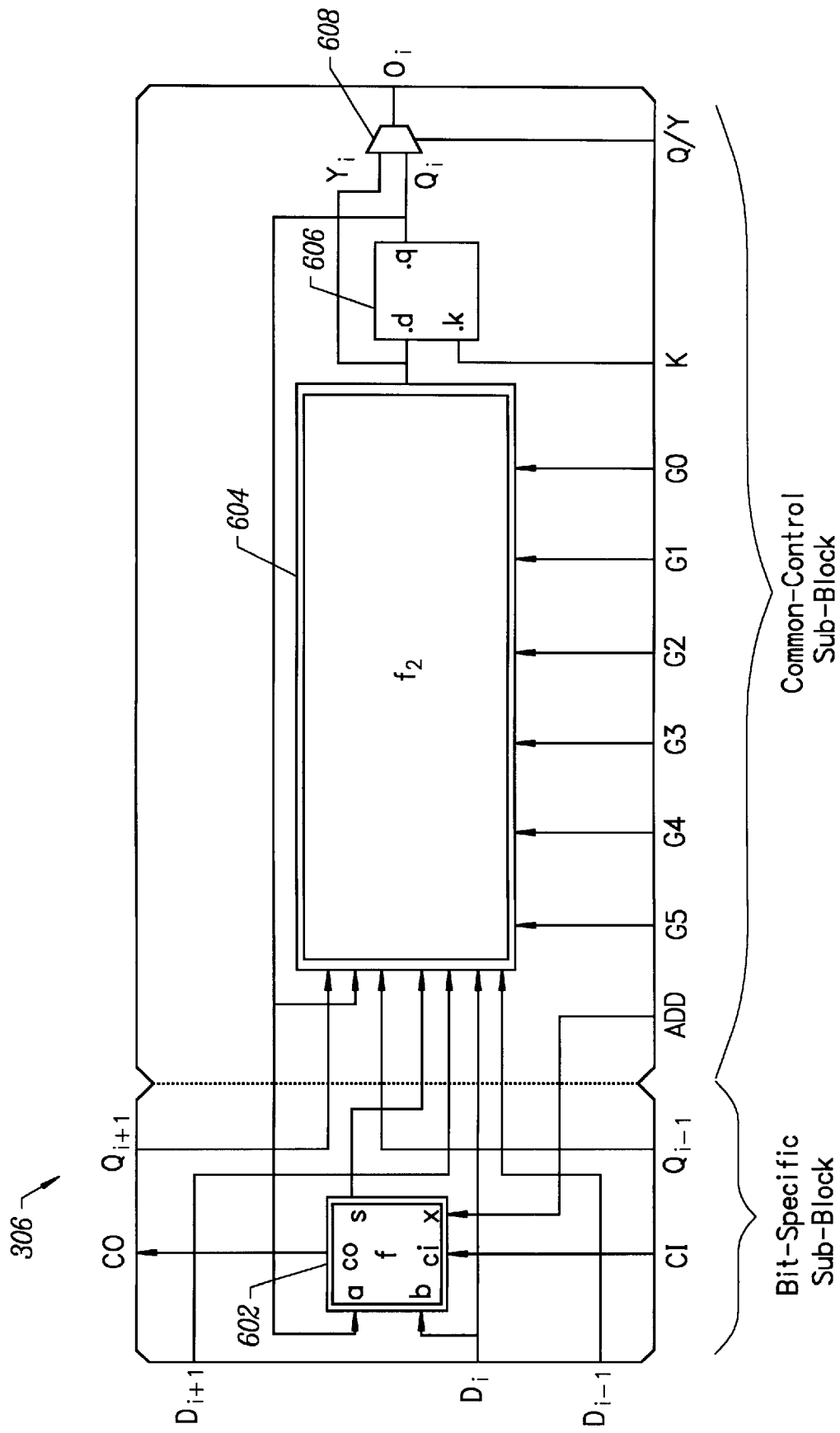
FIG. 6 illustrates a re-programmable bit-slice block in accordance with an alternate embodiment of the invention.
Figure 7:
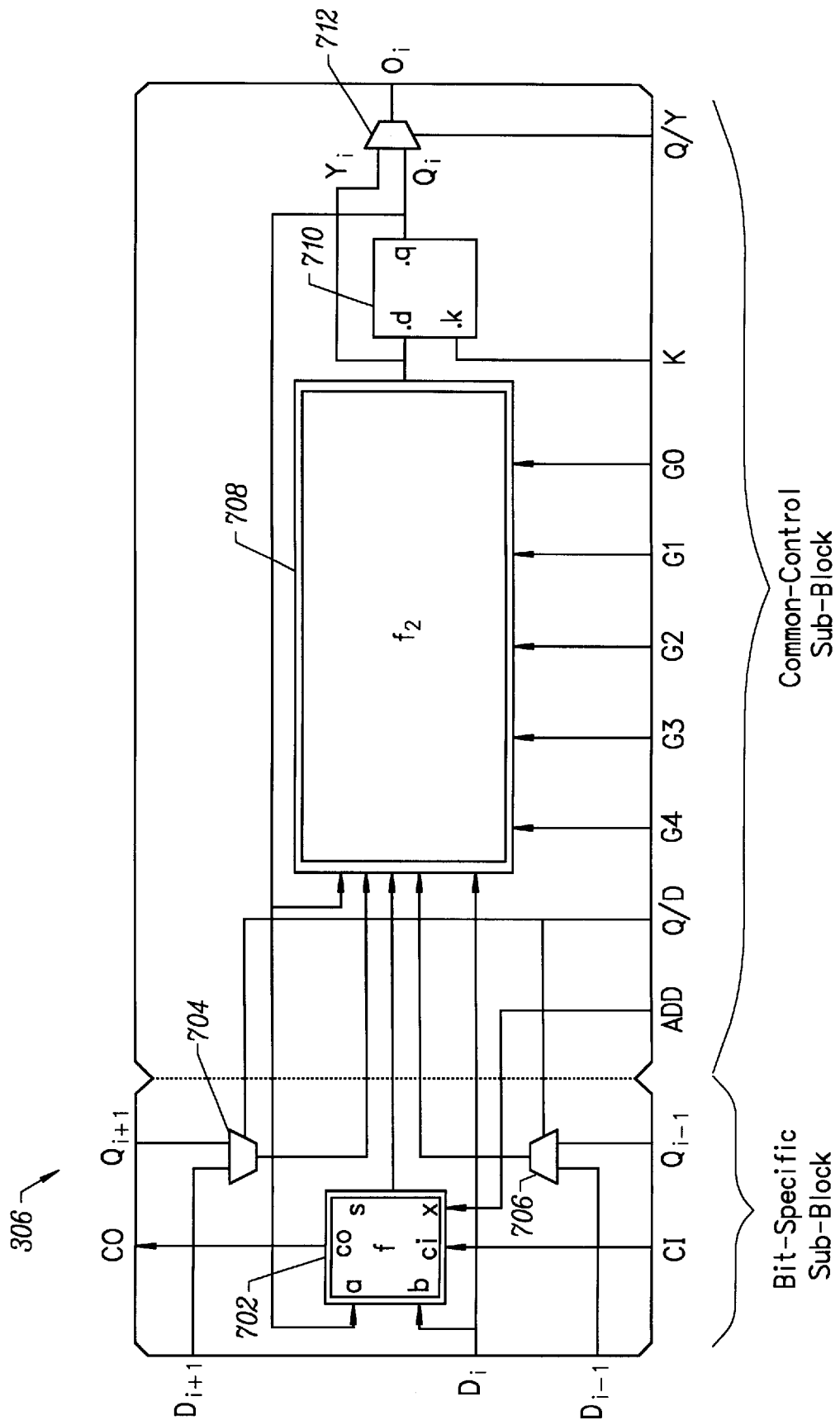
FIG. 7 illustrates a moderately re-programmable bit-slice block in accordance with an alternate embodiment of the invention.
Figure 8:
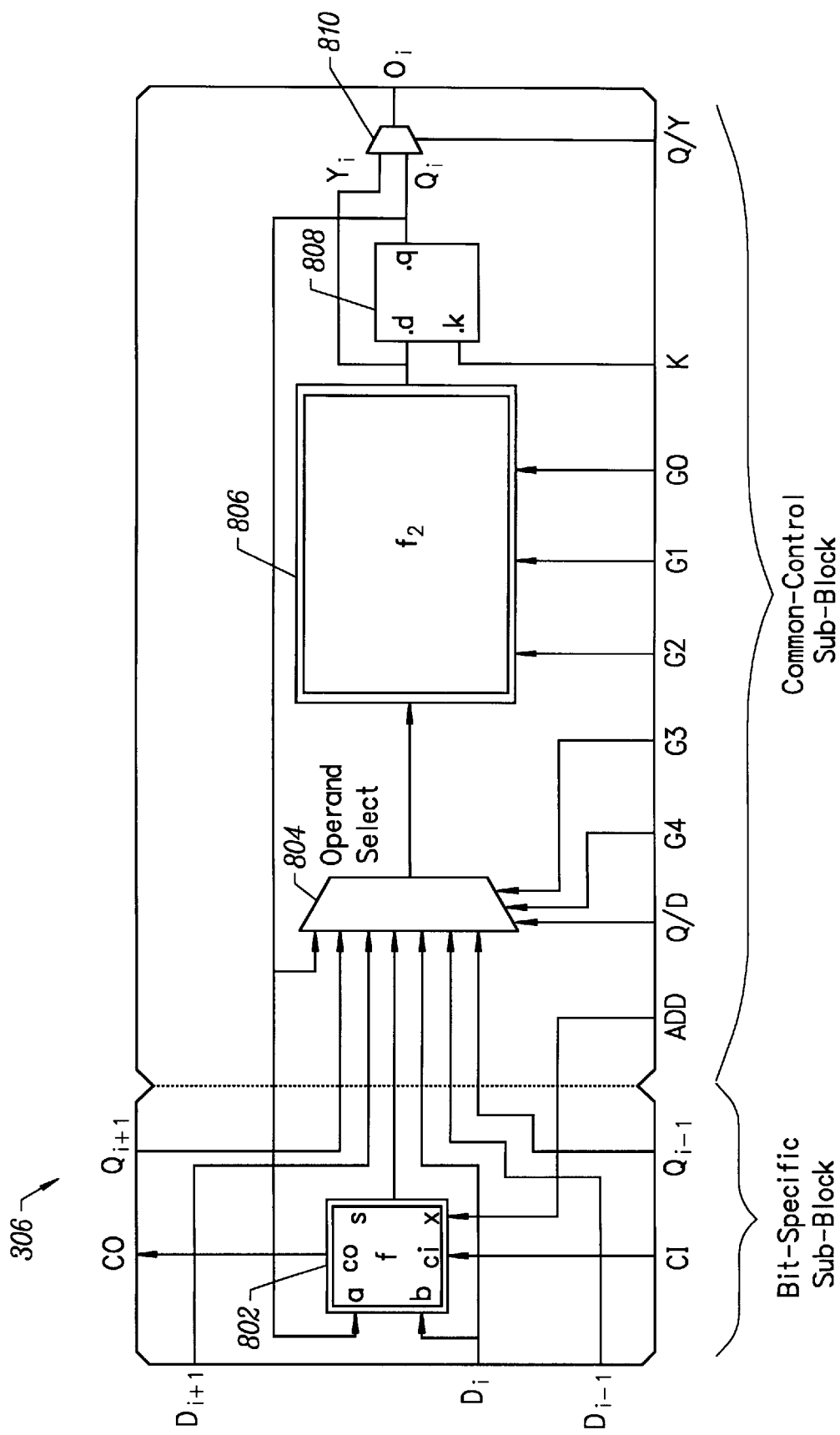
FIG. 8 illustrates a minimally re-programmable bit-slice block in accordance with an embodiment of the invention.

Datapath structures 304 composed of fixed functionality are referred to as fixed function units 312 (FIG. 3B), or FFIUs. As illustrated in FIG. 5A, fixed function units 312 can implement a small number (i.e., 10 or less) of functions. Datapath structures 304 that include look-up table based function generators as shown in FIGS. 6–8 are referred to as reprogrammable function units 314 (FIG. 3B), or RFUs. Although FFUs 312 and RFUs 314 may be controlled by the same control lines, a RFU 314 is more flexible with respect to providing varied functionality.

FIG. 5A illustrates an exemplary fixed function bit-slice block 306. The fixed function bit-slice block 306 includes a carry sum generator 502, a plurality of multiplexers, 504–514, selectively coupled to various input and control signals (D+1, D−1, Qi+1, Qi−1, ADD, Q/D, U/D, SH, L, CE, R, and K), a flip-flop 518 and another multiplexer 520 responsive to a select signal Q/Y. In the exemplary embodiment as shown in FIG. 5A, the reset signal (R) is dominant over all other control signals. Thus, the bit-slice block 306 in FIG. 5A is referred to as a fixed function bit-slice block. The control signals are described in FIG. 5B.

In contrast, in a RFU, any control signal may be made dominant, thus, permitting a wider range of functions. FIG. 6 illustrates an exemplary embodiment of a re-programmable bit-slice block 306 suitable for re-programmable datapath structure 304. In FIG. 6, the bit-slice block 306 includes a carry-sum function generator 602, a n-bit look-up table (f2) 604 capable of implementing any function of n variables, a flip-flop 606, and a multiplexer 608. For example, when n=13, the number of possible functions is $2^{13}$, or 8192 functions. Control is provided by six general purpose lines, G0–G5. However, the more functions a bit-slice block 306 is capable of implementing, the more costly it is to manufacture the device. Thus, it is desirable to customize re-programmability in accordance with specific needs of each case.

FIG. 7 illustrates an exemplary embodiment of a moderately re-programmable bit-slice block 306. In FIG. 7, the bit-slice block 306 includes a carry-sum function generator 702, a plurality of multiplexers 704, 706, a n-bit look-up table (f2) 708 capable of implementing any function of n variables, a flip-flop 710, and a multiplexer 712. In FIG. 7, the n-bit look-up table 708 is a 10 bit look-up table (n=10); thus, the number of possible functions is 2↑10 or 1024 functions. The 10 bit look-up table 708 is controlled by five general purpose lines G0–G4.

FIG. 8 illustrates an exemplary embodiment of a minimally re-programmable bit-slice block 306. In FIG. 8, the bit-slice block 306 includes a carry-sum function generator 802, a multiplexer 804, a n-bit look-up table (f2) 806 capable of implementing any function of n variables, a flip-flop 808, and a multiplexer 810. FIG. 8 illustrates an economical bit-slice block because the operand selection (Di, Di±1, Qi, Qi+1) and the sum output of the carry-sum function generator 802 are input to a 7:1 multiplexer 804 and the n-bit look-up table 806 is a 4 bit look-up table (n=4) controlled by three general purpose lines G0–G2.

Although only bit-slice blocks having arithmetic objects (i.e., carry-sum function generators) are shown in FIGS. 5–8, storage objects, such as random access memory, may also be used.

Figure 9:
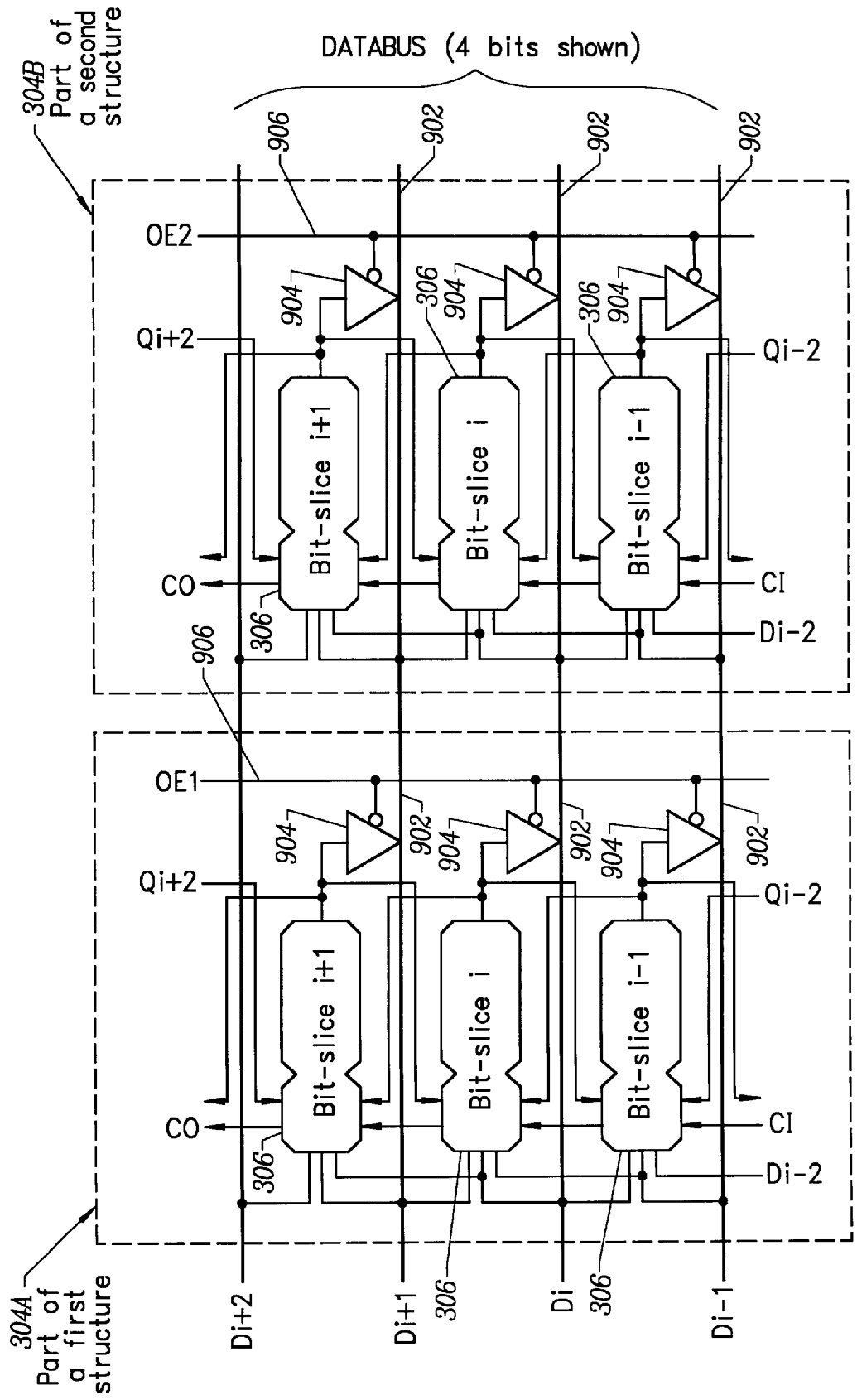
FIG. 9 illustrates an exemplary programmable datapath arithmetic array in accordance with an embodiment of the invention.

FIG. 9 illustrates two sets of three vertically stacked bit-slice blocks 306. In FIG. 9, each set of three bit-slice blocks 306 is a part of a datapath structure 304. Each bit-slice block 306 is connected to a dedicated databus 902 through a three-state bus driver 904. Each three-state bus driver 904 is driven by an output enable signal (OE1 or OE2) on line 906. Each datapath structure 304 has its own bus driver output enable signal (OE) which is common to all three-state bus drivers 904 of that datapath structure 304.

Figure 10:
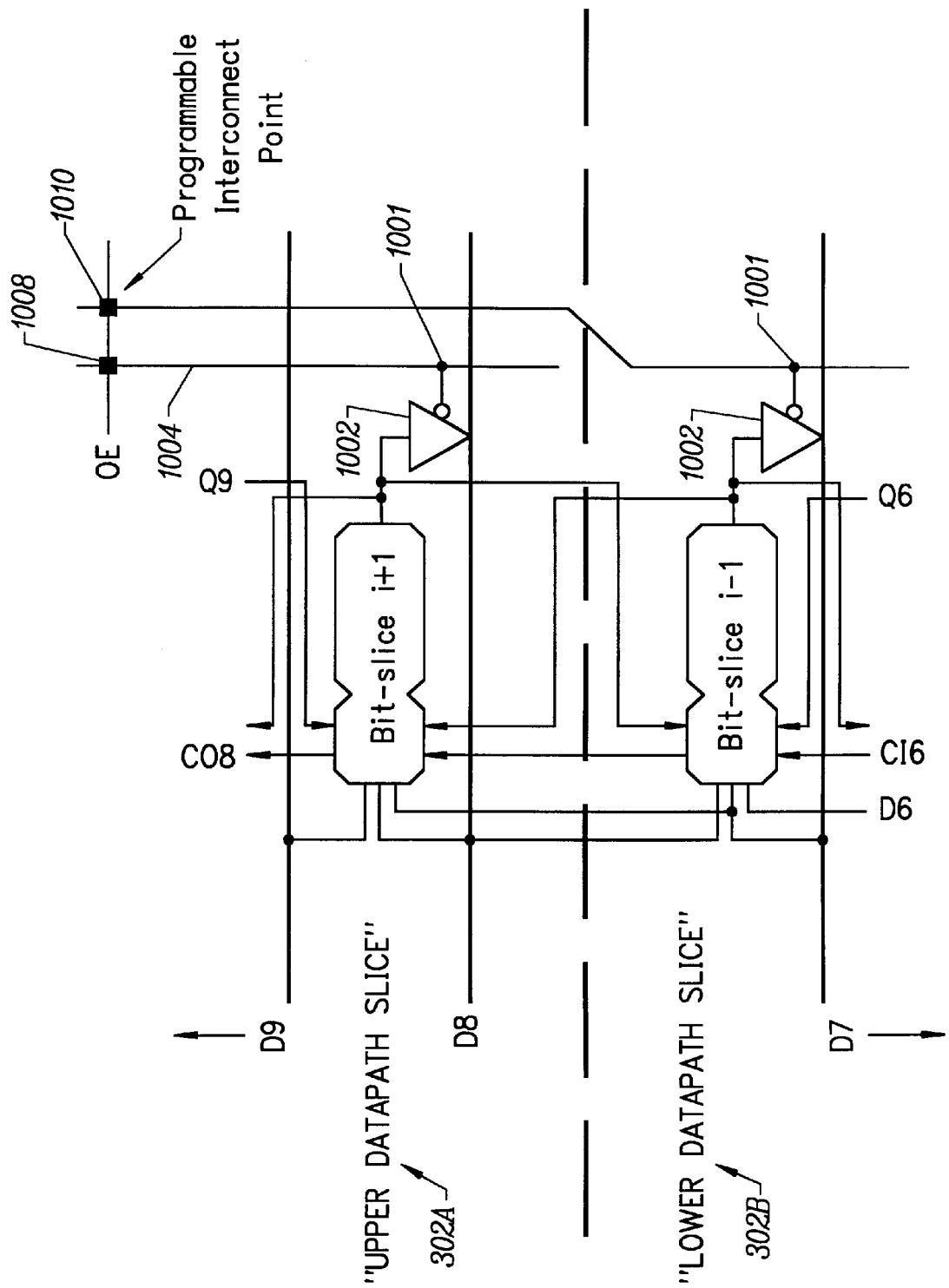
FIG. 10 illustrates another exemplary programmable datapath arithmetic array in accordance with an embodiment of the invention.

FIG. 10 illustrates the concatenatability of the datapath structures 304. In general, vertically adjacent datapath slices 302 can be joined, such that every datapath structure 304 in a lower datapath slice 302 is joined to every datapath structure 304 in an immediately vertically adjacent datapath structure 304. For example, FIG. 10 includes an upper datapath slice 302A and a lower datapath slice 302B. The datapath slices 302A and 302B are joined to each other by hard-wired interconnect points 1001 connected between three-state drivers 1002 and lines 1004 and 1006 are connected to an output signal (OE), and by programmable interconnect points 1008 and 1010, that connect lines 1004 and 1006, respectively, to output enable signal (OE).

The architecture of the invention outperforms generic, reprogrammable logic because the fixed function units 312 provide a dedicated high-speed resource similar to ASIC logic. The invention outperforms fixed function ASIC logic, because the reprogrammable function units 314 provide dynamic and flexible resources similar to field programmable gate arrays.

Various embodiments of the programmable datapath arithmetic array of this invention are advantageous over existing systems because logic resources are explicit, logic resources can be fixed and/or reconfigurable, and routing resources are bit-width extensible (by n-bit multiples). Further, the programmable datapath arithmetic array of this invention allows higher performance datapath functions.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A datapath arithmetic array, comprising:
    a plurality of data buses;
    a plurality of fixed function bit slice blocks coupled to said plurality of data buses and grouped into at least one fixed function datapath structure;
    a plurality of re-programmable function bit slice blocks coupled to said plurality of data buses and grouped into at least one re-programmable function datapath structure; and
    at least one control line in each datapath structure that is coupled to all bit slice blocks within the datapath structure.

2. The programmable datapath arithmetic array of claim 1, wherein each fixed function bit slice block is configured to perform one of a plurality of predetermined functions.

3. The programmable datapath arithmetic array of claim 2, wherein said predetermined functions include storage and arithmetic functions.

4. The datapath arithmetic array of claim 1, wherein at least two of said plurality of datapath structures are coupled via at least one of said plurality of data buses to form a datapath slice in said array.

5. The datapath arithmetic array of claim 4, wherein multiple datapath slices in said array are optionally coupled by one or more control lines.

6. The datapath arithmetic array of claim 1 further comprising:
    a plurality of control lines coupled to each bit slice block in a datapath structure, wherein each of said plurality of control lines is not capable of being decoupled from any bit slice block within said datapath structure to which it is coupled.

7. The datapath arithmetic array of claim 6 wherein at least one bit slice block in a datapath structure is coupled to an adjacent bit slice block in an adjacent datapath structure.

8. The datapath arithmetic array of claim 1 wherein:
    at least one fixed function bit slice block is coupled to a first quantity of operand lines and a second quantity of control lines; and
    said fixed function bit slice block implements less than $2^{**}N$ functions, where N is a sum of said first quantity of operand lines and said second quantity of control lines.

9. The datapath arithmetic array of claim 1 wherein:
    at least one re-programmable function bit slice block is coupled to a first quantity of operand lines and a second quantity of control lines; and
    said re-programmable bit slice block implements $2^{**}N$ functions, where N is a sum of said first quantity of operand lines and said second quantity of control lines.

* * * * *